United States Patent [19]

Bechade et al.

[11] Patent Number: 5,272,729

[45] Date of Patent: Dec. 21, 1993

[54] CLOCK SIGNAL LATENCY ELIMINATION NETWORK

[75] Inventors: Roland Bechade, South Burlington, Vt.; Frank D. Ferraiolo, New Windsor, N.Y.; Bruce Kaufmann, Jericho, Vt.; Ilya I. Novof, Durham, N.C.; Steven F. Oakland, Colchester; Kenneth Shaw, Essex Junction, both of Vt.; Leon Skarshinski, Red Hook, N.Y.

[73] Assignee: International Business Machines, Armonk, N.Y.

[21] Appl. No.: 763,510

[22] Filed: Sep. 20, 1991

[51] Int. Cl.$^5$ .................. H04L 7/00; H04L 25/36; H04L 25/40

[52] U.S. Cl. ........................ 375/118; 371/1; 307/269; 307/511; 328/63; 328/155

[58] Field of Search ............... 375/106, 107, 118, 109; 328/63, 72, 155; 307/480, 443, 269, 511; 371/1

[56] References Cited

U.S. PATENT DOCUMENTS

| | | | |
|---|---|---|---|
| 4,143,328 | 3/1979 | Kurita et al. | 328/155 |
| 4,370,648 | 1/1983 | Wagner et al. | 340/825.2 |
| 4,443,766 | 4/1984 | Belton, Jr. | 328/63 |
| 4,524,448 | 6/1985 | Hüllwegen | 328/72 |
| 4,637,018 | 1/1987 | Flora et al. | 371/1 |
| 4,660,197 | 4/1987 | Wrinn et al. | 371/1 |
| 4,675,886 | 6/1987 | Surie | 307/269 |
| 4,771,441 | 9/1988 | Spengler et al. | 375/106 |
| 4,853,845 | 8/1989 | Zimmer et al. | 364/200 |
| 4,860,322 | 8/1989 | Lloyd | 375/107 |
| 4,872,155 | 10/1989 | Yokogawa et al. | 369/59 |
| 4,929,854 | 5/1990 | Iino et al | 307/480 |
| 4,935,942 | 6/1990 | Hwang et al. | 375/106 |
| 5,022,056 | 6/1991 | Henderson et al. | 375/119 |

OTHER PUBLICATIONS

Chang et al., "Scheme for Reducing Clock Skew in Multiple-Chip System Design", IBM Technical Disclosure Bulletin, vol. 30, No. 2, pp. 568-572, 1987.

Blum, A., "Automatic Adjustment of Several Decentrally Generated Clock Pulse Sequences of a Computer Distributed Over Several VLSI Chips", IBM Technical Disclosure Bulletin, vol. 24, No. 2, pp. 895-897, 1981.

Broockman, E. C., "High Speed On-Chip Addressable Memory Clock", IBM Technical Disclosure Bulletin, vol. 29, No. 12, pp. 5413-5416, 1987.

Puri, et al., "Clock Generator Circuit", IBM Technical Disclosure Bulletin, vol. 25, No. 9, pp. 4505-4507, 1983.

Grimes, D. W., "Skew Detector and Corrector for A Disk, Drum, or Tape Storage", IBM Technical Disclosure Bulletin, vol. 18, No. 1, pp. 164-167, 1975.

Gindi, A. M., "Deskewing System for Parallel Recorded Data", IBM Technical Disclosure Bulletin, vol. 10, No. 1, pp. 37-39, 1967.

Debrod et al., "Transmission Delay Cancellation Mechanism on Very High Speed Birdirectional Buses", IBM Technical Disclosure Bulletin, vol. 32, No. 7, pp. 245-247, 1988.

Concha et al., "Low-Cost Clock Generator Circuit", IBM Technical Disclosure Bulletin, vol. 30, No. 11, pp. 394-396.

Kleinman, D. A., "Logic Chip Performance Customization", IBM Technical Disclosure Bulletin, vol. 31, No. 7, pp. 301-303, 1988.

Mather, A. N. "Tolerance-Compensated Circuit for CMOS VLSI Clock Distribution", IBM Technical Disclosure Bulletin, vol. 30, No. 4, pp. 1453-1454, 1987.

Ludwig et al., "Tolerance Compensation for CMOS Circuits", IBM Technical Disclosure Bulletin, vol. 28, No. 5, pp. 2132-2133, 1985.

Primary Examiner—Curtis Kuntz
Assistant Examiner—Don N. Vo
Attorney, Agent, or Firm—Heslin & Rothenberg

[57] ABSTRACT

A process independent digital clock signal timing network is described for generating a chip clock substantially in phase with and offset by one cycle from an input clock signal. The timing network determines the delay experienced by a clock signal passing through a predetermined internal clock circuit on the chip and pregates the internal clock circuit by an amount equivalent to the determined delay such that the chip clock signal output from the internal clock circuitry lags the external clock signal input to the semiconductor chip by one cycle. Various timing network embodiments are described and claimed.

24 Claims, 12 Drawing Sheets

CLOCK SIGNAL LATENCY ELIMINATION NETWORK

BACKGROUND OF THE INVENTION

1. Technical Field

This invention relates in general to integrated semiconductor chip timing or clock circuitry and, more particularly, to a digital network for reducing or eliminating clock latency created on chip by an internal clock generator, and thereby reducing clock skew between semiconductor chips in a multichip system.

2. Background Art

Almost all semiconductor microprocessor and logic chips receive an external clock signal. The external signal is often reshaped in a clock generator, or at least buffered in a logic tree for distribution across the chip. These generators/buffers introduce a delay between the external clock and the internal clock distributed on chip. This delay is termed "clock latency." The clock latency can vary significantly with process, temperature and voltage variations. The total delay between an externally generated crystal oscillator and the internal circuitry of a semiconductor chip can be in the order of several nanoseconds.

The clock path is often one of the limiting paths affecting overall achievable system speed. The clock path has a nonzero delay, and hence delay tolerances associated with the manufacturing, temperature and supply voltage. In many cases where the clock path limits overall system performance, the delay tolerance in the clock path directly impacts the system cycle time one for one. CMOS processes have especially wide tolerances. Clock paths can vary from best case to worst case by as much as 3 times, for example, a ten nanosecond clock path can vary from five to fifteen nanoseconds. Hence the designer must account for this uncertainty in the clock by decreasing the system clock speed. This causes the entire system performance to suffer.

Further, clock latency can vary significantly between semiconductor chips within a given system. For example, a multichip semiconductor system may have a best case to worst case chip clock latency of from four to ten nanoseconds. This difference between worst and best chip clock latencies comprises a clock skew between the different modules of the system. The clock skew also operates to limit system performance. In order for a design to be manufacturable, the design must be able to operate over the tolerances associated with the final product's environment and manufacturing process. If the design cannot operate within these tolerances, then screens must be inserted to differentiate products that do not operate when manufactured from those that do. Screening decreases yield which increases the cost of the final product.

The alternative to screening is to relax the product performance standards until the design can meet the temperature, power supply and manufacturing variations present in the system, which is an equally undesirable alternative.

Therefore, an on chip clock timing circuit is desirable for improved semiconductor chip and semiconductor system performance, and in particular, for reducing or eliminating internal clock latency and reducing clock skew between chips of a multichip system.

DISCLOSURE OF INVENTION

Briefly described, this invention comprises a semiconductor chip circuit for generating at the output of a predetermined internal clock circuit, a chip clock signal which is in phase with and offset by one cycle from an input clock signal, such as an external crystal oscillator generated clock signal. In a first broad aspect, the semiconductor chip circuit includes determining means for identifying the delay experienced by a clock pulse passing through the predetermined internal clock circuit. Coupled to this delay determining means is a trigger means for initiating a delay clock signal within the internal clock circuit such that the chip clock signal output therefrom is in phase with and offset by one cycle from the input clock signal. The delay clock signal is triggered within the predetermined internal clock circuit at a time equal to the period of the input clock signal minus the length of time of the determined delay through the predetermined internal clock circuit.

In an alternate embodiment, the invention comprises a digital clock timing network for an integrated circuit chip having an internal clock circuit with a predetermined delay therethrough. The clock timing network receives an input clock signal and generates therefrom a timing signal. The timing signal is passed through the chip's internal clock circuit to produce a chip clock signal which is in phase with and offset from the input clock signal by one cycle. The digital clock timing network includes a delay circuit having an input coupled to receive the input clock signal. The delay circuit has a plurality of serially connected delay states, each of which outputs a corresponding delay signal as the input clock signal propagates through the delay circuit. A plurality of pulse generators is coupled such that each generator receives a respective one of the delay circuit delay signals and outputs in response thereto a pulse signal. Each pulse signal has a duration substantially less than the period of the input clock signal. A control network is coupled to receive as input the pulse signals output from the plurality of pulse generators and to generate therefrom a timing signal for output to the internal clock circuit. The timing signal has the period of the input clock signal less an interval of time substantially equal to the predetermined delay through the internal clock circuit of the integrated circuit chip such that passing of the timing signal through the internal clock circuit produces a chip clock signal output substantially in phase with and offset by one cycle from the input clock signal.

A further embodiment of the present invention comprises an integrated semiconductor chip circuit for reducing clock latency resulting from passing an input clock signal through a predetermined internal clock circuit to produce a chip clock signal. The predetermined internal clock circuit includes a receiver and a clock powering logic. The integrated semiconductor chip circuit includes a variable delay element connected between the receiver and the clock powering logic of the predetermined internal clock circuit. The delay element has a control input for receiving a select signal which will be determinative of the amount of delay through the variable delay element. The variable delay element receives at a first input the input clock signal after the signal has passed through the receiver of the predetermined internal clock circuit. A phase detector is coupled to receive as inputs the input clock signal applied to the variable delay element and a chip clock signal output from the clock powering logic. The phase detector outputs a phase difference signal representative of the difference in phase between its clock inputs. Lastly, control circuitry is associated with the phase detector for receiving the phase difference signal and producing therefrom a select signal. The control circuitry includes a means for applying the select signal to the control input of the variable delay element. The select signal operates to select the clock delay through the variable delay element such that the chip clock signal output from the clock powering logic is substantially in phase with and offset by one cycle from the input clock signal. Numerous additional circuit enhancements for each aspect of the present invention are described and claimed herein.

To summarize, the present invention comprises a digital clock timing network for reducing or eliminating clock latency created on chip by an internal clock generating circuit. By reducing clock latency on chip, clock skew between semiconductor chips in a multichip system is also reduced. The clock timing network is process independent, being totally digital and requiring no analog or external components. The network dynamically compensates for delay variations in the clock path as a function of temperature, power supply and/or manufacturing tolerances. The network can be implemented in gate array digital logic and is particularly advantageous for CMOS technology. Further, the network can be implemented at multiple points in a clock distribution tree, and provides improved system performance using lower cost technology.

BRIEF DESCRIPTION OF DRAWINGS

These and other objects, advantages and features of the present invention will be more readily understood from the following detailed description of certain preferred embodiments thereof, when considered in conjunction with the accompanying drawings in which.

BEST MODE FOR CARRYING OUT THE INVENTION

Reference now is made to the drawings in which the same reference numbers are used throughout the different figures to designate the same or similar components.

Figure 1:
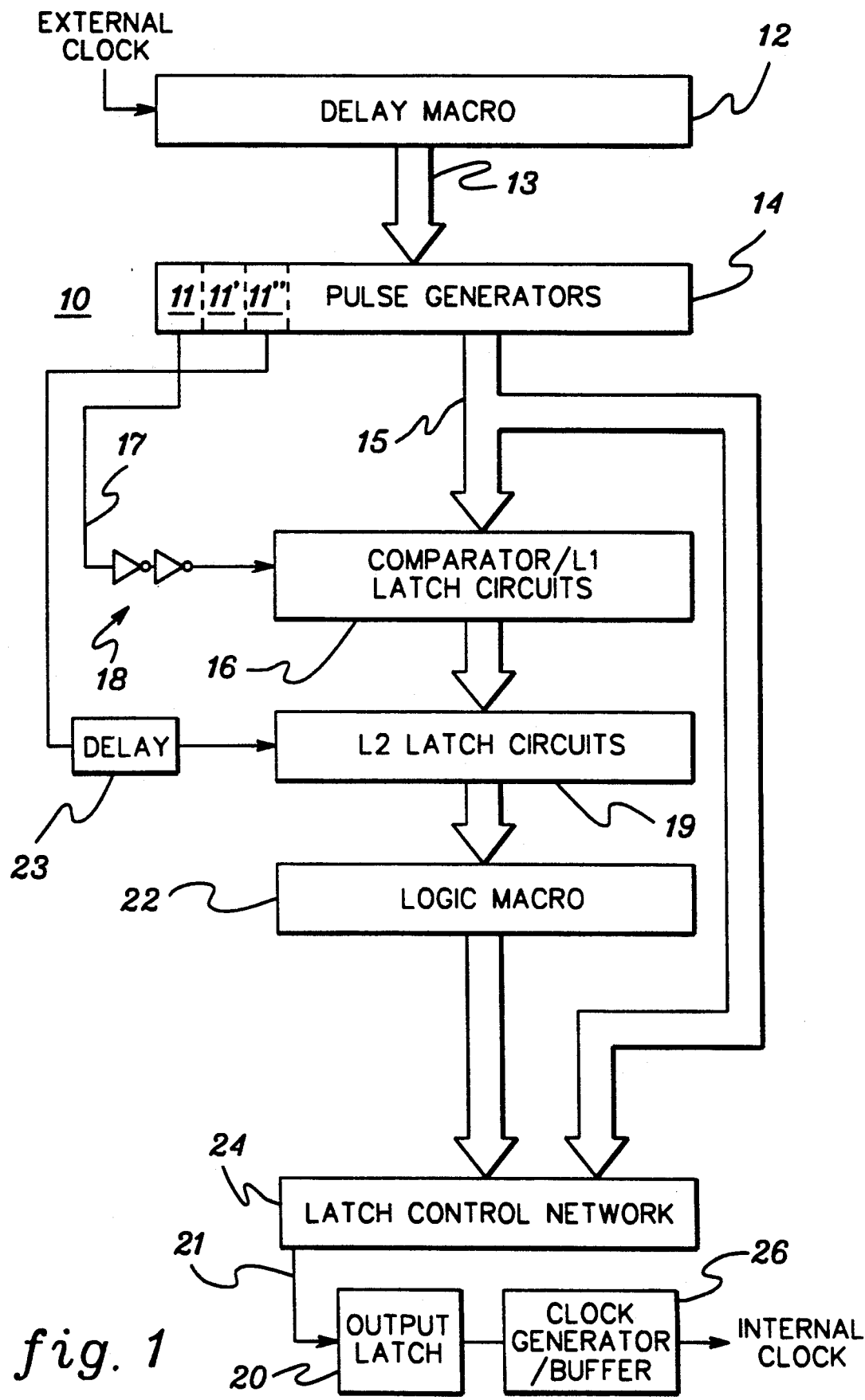
FIG. 1 is a schematic overview of one embodiment of a clock signal latency elimination network pursuant to the present invention.

FIG. 1 depicts one embodiment of a clock signal latency elimination network, generally denoted 10, pursuant to the present invention. In this digital embodiment, an external clock having a substantially constant frequency is received at the input to a delay macro 12. Delay macro 12 outputs a plurality of sequential delay signals on a plurality of lines 13 to pulse generators 14. Each delay signal, which is delayed from the previously outputted delay signal by the delay of the delay stage therebetween, is fed to a separate one of a plurality of pulse generators 14. Each pulse generator outputs a pulse signal in response to a received delay signal. The pulse signals are output on lines 15 to the inputs of comparator/L1 latch circuits 16 (in addition to the inputs to a latch control network 24 described below). A first generator 11 also outputs a first pulse signal on line 17 to circuit 16 through a buffer, e.g., two serially connected inverters 18. As explained further below, circuits 12, 14, & 16 cooperate to continuously determine the frequency (or period) of the external clock signal input to network 10.

The information in the L1 latch circuits is stored every cycle in a second set of latches, L2 latch circuits 19. L2 latch circuits 19 are set two or three nanoseconds after a rising edge of the received external clock. By way of example, this can be accomplished by feeding the third pulse signal output from the third generator 11″ of generators 14 to the clock inputs of the latches in circuits 19 through a delay circuit 23. As described below, each L2 latch gates an output of the pulse generators that is X steps previous to the L2 latch location along the delay line.

Network 10 further includes a divide by two output latch 20 which is serially connected to a clock generator/buffer 26. Latch 20 which is triggered to produce the desired internal clock signal at the output to generator/buffer 26, is clocked by a control signal (received on line 21) generated by a logic macro 22 and a latch control network 24 coupled thereto. If desired, two or three adjacent L2 latches may be used to gate the latch control network, however, the remaining L2 latches must be disabled to protect against the case where the external clock frequency is half or less the delay of the delay line. Each of the L2 latches gates the N−X delay step to anticipate the occurrence of the next clock. The number of delay steps X is predetermined by circuit delay simulation. The delay of the clock generator (and any associated clock receiving circuitry) can be offset entirely by gating the internal clock generator earlier by a delay X equivalent to it's internal delay. Since the basic step delay tracks the internal delay of the generator, the difference in latency between slow and fast chips in a multichip system will be minimal. Circuit 22 functions to isolate the first latch in circuit 19 to identify a pulse signal as repeating. A signal from this isolated latch (N) enables the control signal (N−X) to be transmitted to the clock input of latch 20.

A more detailed description of each of the major circuit components of network 10 is next provided below with reference to FIGS. 2-8.

Figure 2:
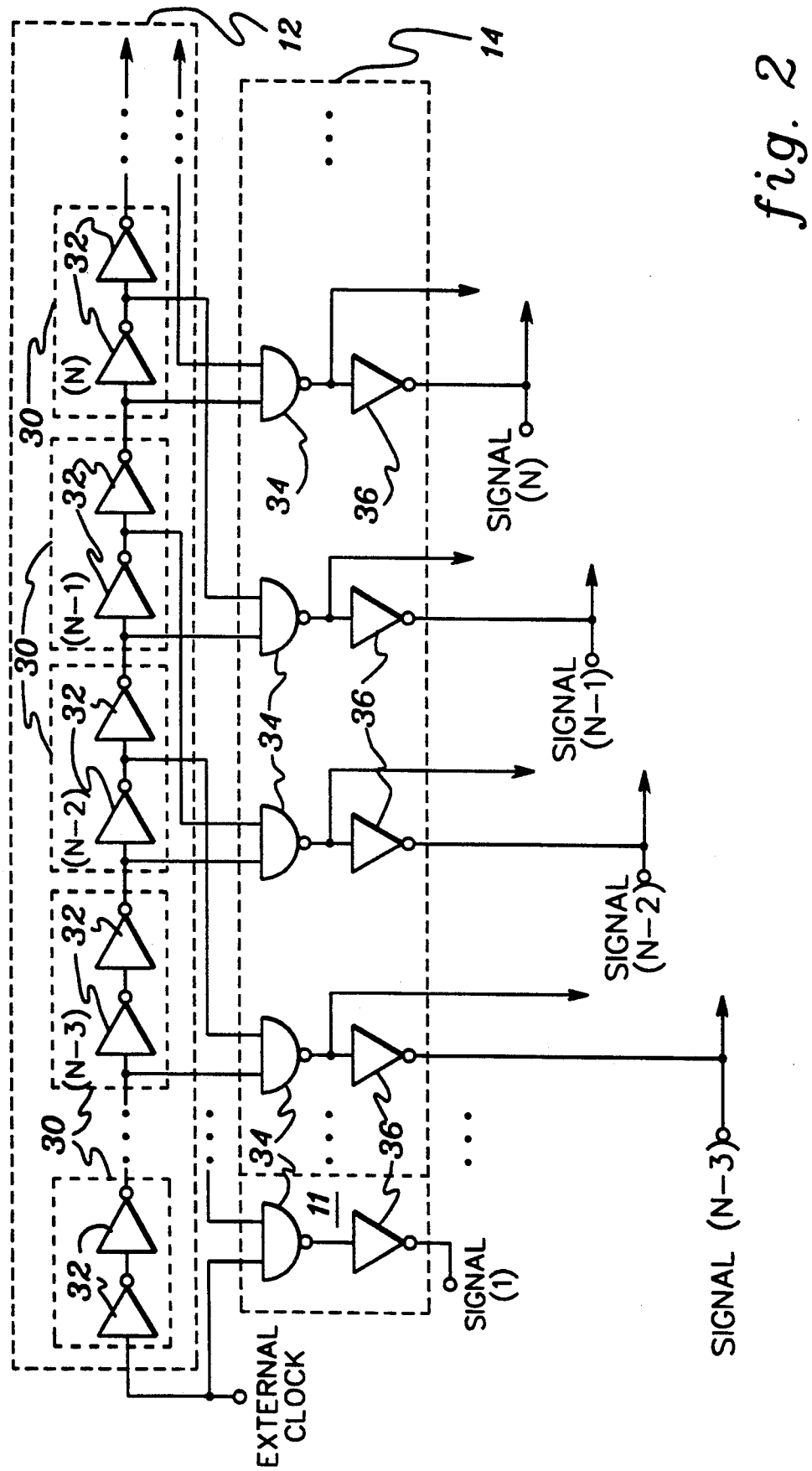
FIG. 2 is a more detailed schematic of the delay macro and pulse generators of the network embodiment of FIG. 1.

Referring first to FIG. 2, one embodiment of circuitry components 12 & 14, which continually respond to the external clock signal, is shown. Delay macro 12 includes a plurality of serially connected delay stages 30, each of which includes, e.g., two inverters 32. (Those skilled in the art will recognize that alternative delay circuitry could also be used.) The output of the first inverter in each stage is connected to the input of the second inverter therein. The delay stages cooperate to sequentially produce the delay signals output therefrom. Each outputted delay signal comprises the external clock signal delayed by the amount of corresponding delay in circuit 12 preceding the signal's output. Along with the first delay stage, stages (N), (N−1), (N−2) and (N−3) out of the plurality of delay stages are depicted for discussion. In general, lowering the delay stage time and increasing the number of delay stages 30, along with the subsequent circuitry corresponding thereto (described below), improves the timing resolution of the clock signal output from network 10.

Figure 3:
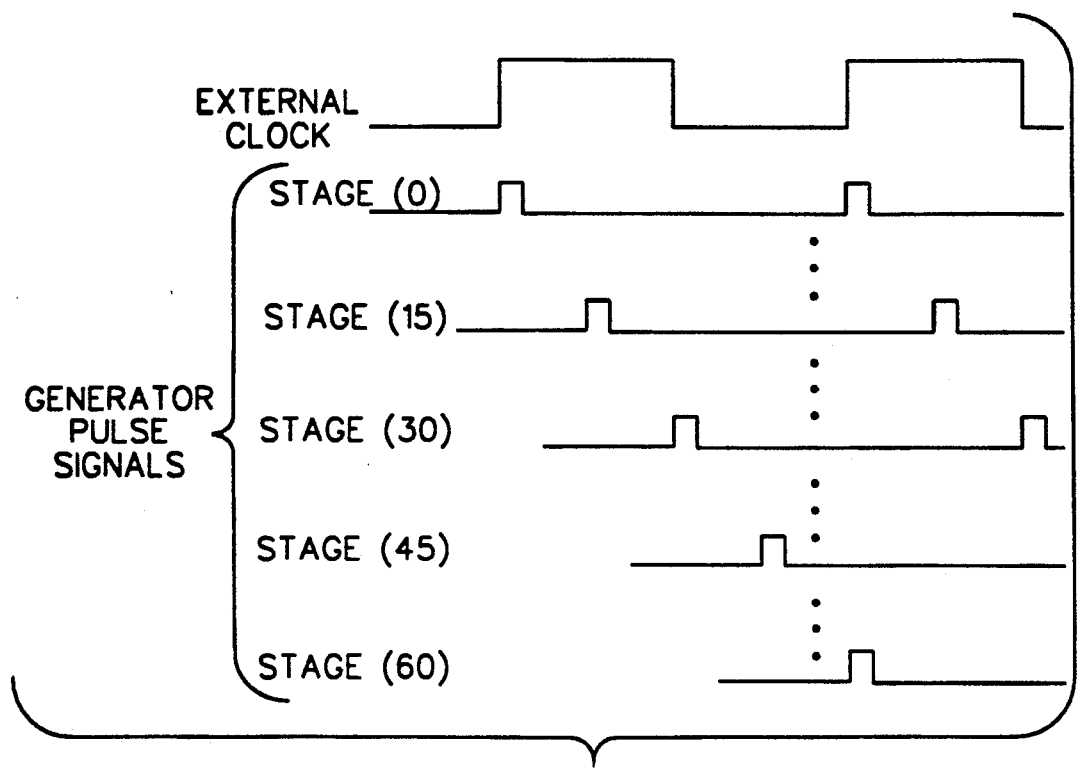
FIG. 3 is a timing diagram of the received external clock signal in comparison with several generated pulse signals output from the pulse generators of FIG. 2.

Again, the delay clock signals output from the delay line delay stages are input to generating circuit 14, which includes a plurality of pulse generators. Preferably, there is one pulse generator for each delay stage of network 10. In the embodiment shown, each pulse generator includes a two input NAND gate 34, which has a first input tied to an input of the corresponding delay stage and a second input tied to delay macro 12, for example, at one and a half delay stages subsequent thereto. The delay between the clock signals presented at the two NAND gate inputs is determinative of the width of the pulse signal outputted from the NAND gate. Each NAND gate 34 output passes through an inverter 36. By way of example, FIG. 3 depicts a sample external clock waveform and certain generated pulses outputted from circuit 14 in response thereto, i.e., a pulse signal corresponding to stage (0), stage (15), stage (30), stage (45) and stage (60). (The figure assumes that the external clock repeats at stage (60).) The signals from both gates 34 and inverters 36 are applied to associated comparator/L1 latch circuits 16, as shown in FIG. 4.

Figure 4:
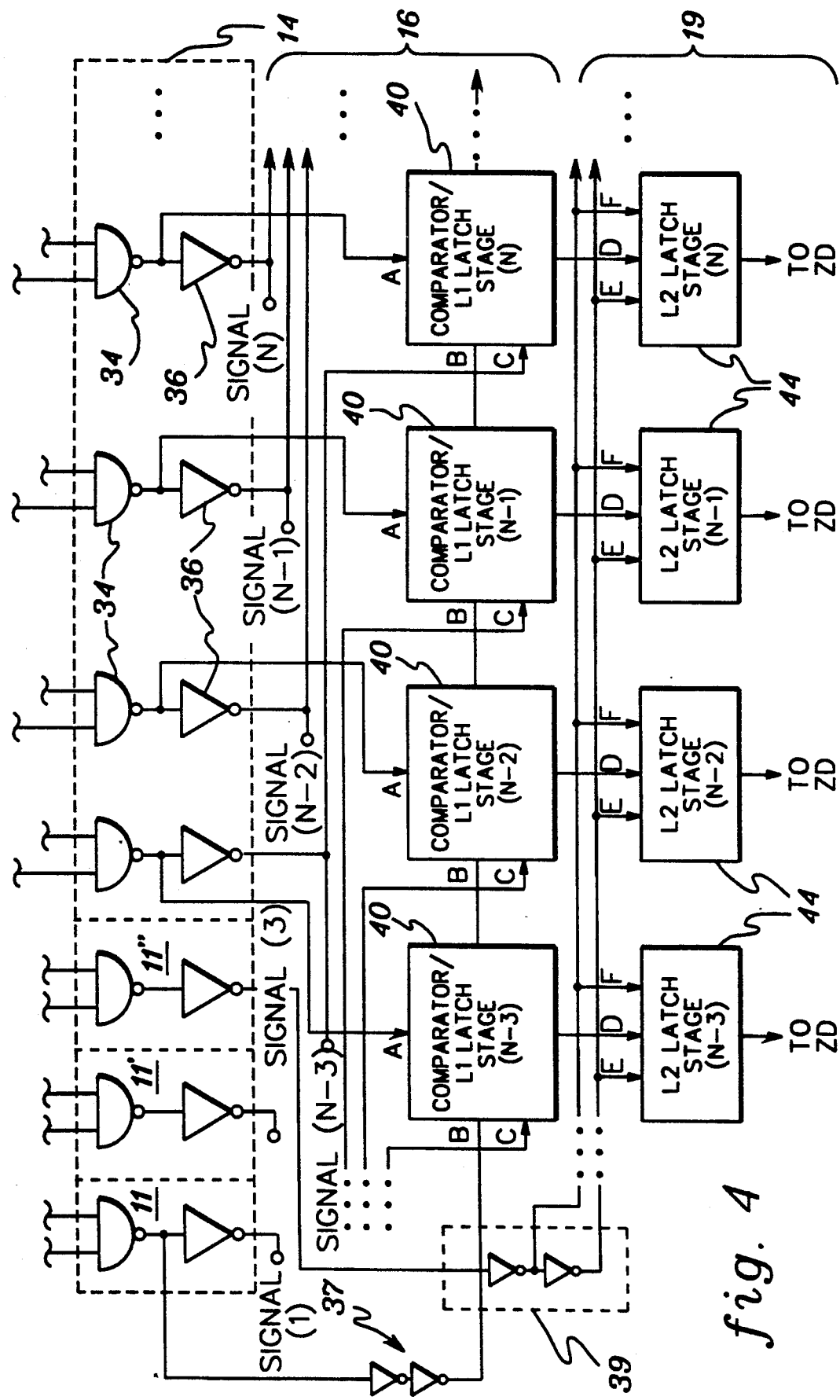
FIG. 4 is a more detailed schematic of the pulse generators, comparator/L1 latch circuits and L2 latch circuits of the network embodiment of FIG. 1.

The connections between comparator/L1 latch stages of circuit 16 are also shown in greater detail in FIG. 4. As noted, Circuit 16 includes a plurality of stages of which only comparator/latch stages (N−3) through stage (N) are shown. In practice, the number of comparator/L1 latch stages 40 may be less than the number of pulse generating stages (which preferably equal the number of delay stages in circuit 12). This is because the function of these circuits is to identify the pulse signal corresponding to a complete period of the external clock signal input to macro 12. If, for example, there are 66 delay stages to delay macro 12 and 66 pulse generator stages to circuit 14, less than 66 comparator/latch stages may be used since it can typically be assumed that the external clock signal will not repeat within a certain number of initial delay stages. For example, within the first ten stages. Network 10 is configured to accommodate a specific clock signal frequency or a specific range of clock signal frequencies. Network switching accuracy is obviously reduced should the external clock signal repeat at the 10th stage or below in comparison with, for example, noting repetition at the 40th stage of a 66 stage network. In the discussion below, therefore, it is assumed that examination for coincidence of signals is begun at delay stage 11 (which will comprise the first comparator/L1 latch stage 40).

In the embodiment shown, each comparator/latch stage 40 has three inputs; namely, an A input for receiving the pulse signal output from the corresponding pulse generator stage (for the comparator/L1 latch circuit 40 described below in connection with FIG. 5 this signal is taken directly at the output of the respective NAND gate 34), an input B for receiving pulse signal (1) output from pulse generator 11 (FIG. 1), and a reset input, input C, for receiving the (N−3) pulse signal. The pulse signal from NAND gate 34 of the first generator stage 11 (FIG. 1), after passing through a double invert buffer 37, is applied to each of the comparator/L1 latch stages 40 at input B.

Figure 5:
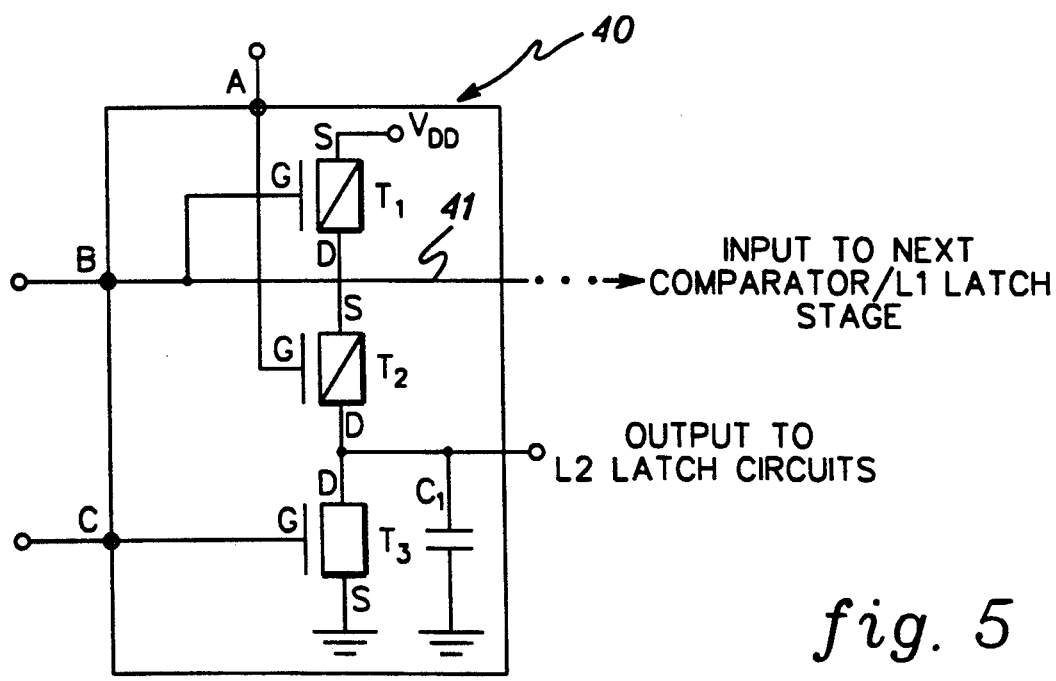
FIG. 5 is a schematic of one embodiment of the comparator/L1 latch stage circuits of FIG. 4.

Referring to FIG. 5, a preferred embodiment of the comparator/L1 latch stage circuit 40 is shown. The circuit includes complementary metal oxide semiconductor (CMOS) circuits with P-channel field-effect transistors (PFETs) indicated in the drawing by a rectangle with a diagonal line formed therein and a control element or gate electrode arranged adjacent thereto and with N-channel field-effect transistors (NFETs) indicated by a rectangle without a diagonal line and with a control element or gate electrode arranged adjacent thereto.

This comparator/L1 latch stage circuit 40 includes a dynamic latch and is most suitable for frequencies of, for example, 1 MHz or above. A first PFET $T_1$ has its source "S" connected to circuit voltage $V_{DD}$ and its drain "D" connected to the source "S" of a second PFET $T_2$. PFET $T_1$ is gated "G" by the first pulse signal outputted from generator 11, which is received at input B to circuit 40. This first pulse signal is also passed through circuit 40, for example, on line 41, to the next adjacent circuit 40 (see FIG. 4) of the plurality of comparator/latch stages. PFET $T_2$ has its drain "D" connected to a first terminal of a capacitor "$C_1$", the second terminal of which is connected to ground. PFET $T_2$ is gated "G" by the pulse signal output from the corresponding stage of the pulse generators, which again is received at input A. Thus, in order for charge to flow to capacitor "$C_1$", the pulse signals received at input A and input B must simultaneously activate the respective PFETs. This is only true when the external clock signal begins to repeat (compare, e.g., the pulse signals at stage (0) and stage (60) in FIG. 3). Where the clock signal begins to repeat, the number of delay stages between pulse signal A and pulse signal B is representative of the period (or frequency) of the external clock signal. Should the pulse signals at inputs A and B not overlap, then capacitor "$C_1$" remains uncharged.

After an initial pass through the network, at least one comparator/L1 latch stage should be set, i.e., have its capacitor "$C_1$" charged as an indication of repetition of the external clock signal. Prior to propagation of the next clock cycle through the network any set latch must be reset. In particular, prior to considering the next corresponding pulse signal at input A, capacitor "$C_1$" must be discharged. Reset is accomplished in circuit 40 by an NFET $T_3$ which is coupled in parallel with capacitor "$C_1$". NFET $T_3$ has its drain "D" connected to the first terminal of capacitor "$C_1$" and its source "S" connected to ground. In the embodiment depicted, the pulse signal from the (N−3) generator stage is supplied to the Nth stage and, in particular, to gate "G" of NFET $T_3$ through input C to circuit 40. When high, this pulse serves to discharge the capacitor so that circuit 40 is cleared prior to consideration of its next corresponding pulse signal (i.e., from stage N) received at input A.

It should be noted that use of the (N−3) pulse signal (i.e., the signal received at input C) to clear the Nth stage is somewhat arbitrary. A different pulse signal could be selected and function equally well so long as the different signal is not generated too far from stage N such that it will interfere with selection of a new coincidence stage should the input clock period vary (e.g., N+1, N−1, ...), i.e., assuming coincidence was previously located at stage N of the network. The voltage across capacitor "$C_1$" comprises the output of circuit 40 to the corresponding L2 latch of circuits 19 (FIG. 4). Those skilled in the art will recognize that depending upon the frequency of the external clock signal, it may be desirable to replace the dynamic latch of FIG. 5 with a static latch.

Returning to FIG. 4, the output of each comparator/L1 latch stage is fed to the D input of a corresponding L2 latch stage. Preferably, there is an L2 latch stage 44 for each comparator/L1 latch stage 40. Each L2 latch stage 44 also has an E input for receiving the pulse signal output from the third pulse generator 11″ (twice inverted 39) and an F input for receiving the pulse signal output from the third pulse generator 11″ (once inverted). The output of each L2 latch stage 44 is transmitted to one of the zero detect circuits of logic macro 22, described below.

Figure 6:
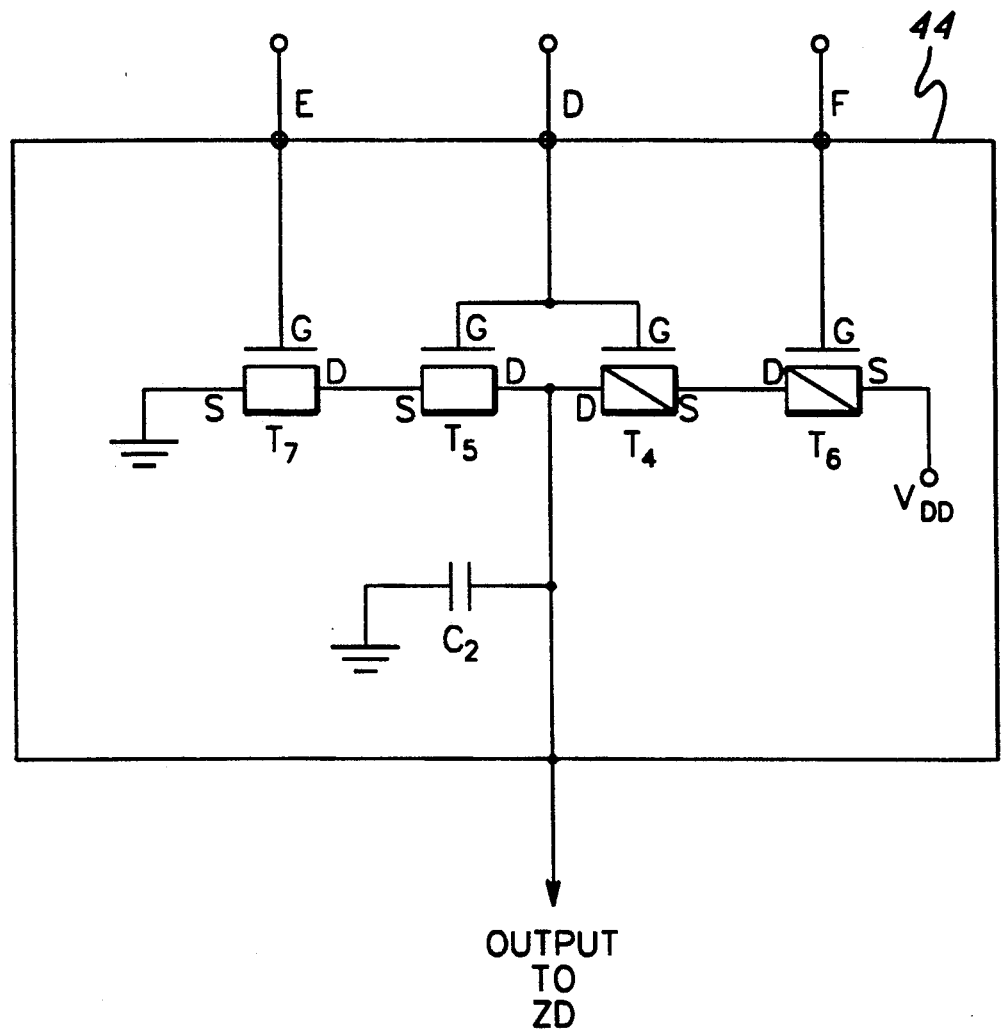
FIG. 6 is a schematic of one embodiment of the L2 latch stage circuits of FIG. 4.

A preferred embodiment for L2 latch stage 44 is shown is FIG. 6. The signal received at input D from the corresponding L1 latch stage is used to simultaneously gate a PFET $T_4$ and an NFET $T_5$, the drains "D" of which are coupled together. PFET $T_4$ and NFET $T_5$ drains "D" are connected to a first terminal of a capacitor "$C_2$", the second terminal of which is connected to ground. The source "S" of PFET $T_4$ is coupled to the drain "D" of a second PFET $T_6$ which has its source "S" connected to circuit voltage $V_{DD}$. The gate G of PFET $T_6$ is driven by the pulse signal received at input F to circuit 44. Thus, in order for charge to flow to capacitor "$C_2$", the pulse signals received at inputs D and F must simultaneously activate the respective PFET's.

In operation, after propagation of an external clock signal through the network, at least one L1 latch stage 40 should be set, i.e., have its capacitor "$C_1$" (FIG. 4) charged as an indication of the repetition of the external clock signal. At the beginning of the next external clock cycle, inputs E & F to L2 latch circuits 19 are each simultaneously enabled. With a set signal in an L1 latch stage and enabled E & F inputs, the corresponding L2 latch stage 44 has its capacitor "$C_2$" discharged. This is because a high signal at transistors $T_6$ & $T_4$ will disable the PFETs, while a high signal at transistors $T_5$ & $T_7$ will activate the NFETs, thereby shorting the capacitor to ground. Thus, a set state in an L1 latch stage will be reset in the corresponding L2 latch stage. Similarly, an unset state in an L1 latch stage will be set in the corresponding L2 latch stage. The L2 latch stage in essence stores an inverted signal from that held by the corresponding L1 latch stage.

Figure 7:
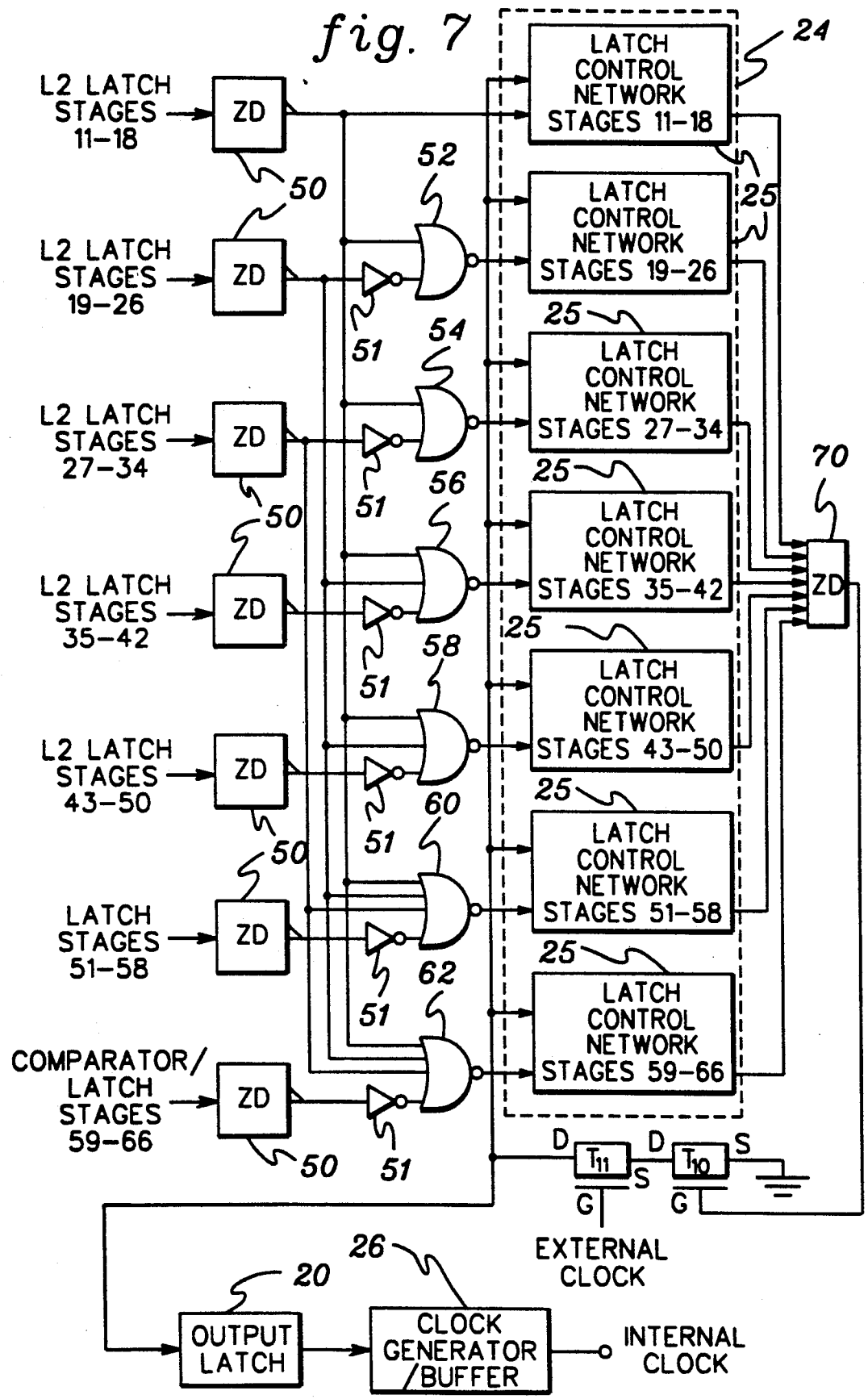
FIG. 7 is a schematic of one embodiment of the logic macro and latch control network circuits of FIG. 1.

Referring next to FIG. 7, the logic macro observes all comparator/latch stage 44 outputs (i.e., the "To ZD" lines of FIG. 4) and gates to the latch control network 24 only the first latch stage to have been set. By way of example, if the delay macro includes 66 stages and the external clock signal input thereto repeats after 20 stages, L2 latch stages (20), (40) and (60) will be set. The logic macro is configured such that only L2 latch stage (20) is gated to its output, i.e., to latch control network 24. Each zero detect "ZD" circuit 50 at the input to the logic macro is configured, for example, to receive 8 output signals (i.e., the value across capacitor "$C_2$" at the output of each circuit 44) from the corresponding L2 latch stages (FIGS. 4 & 6). In the presented embodiment, the output of each L2 latch stage is assumed to be inverted (not shown) prior to input to ZD circuit 50.

As noted above, delay line delay intervals are preferably selected such that the external clock signal will not repeat within a certain number of initial stages, e.g., within the first ten stages. Therefore, comparator/L1 latch circuits and L2 latch circuits corresponding to these stages can be omitted, and zero output detection (or more precisely, non-zero output detection) begins with stage 11 as indicated in FIG. 7. The output signals from zero detects 50 are each inverted such that a logic one appears at the output of a detect circuit whenever one of the received and inverted L2 latch stage signals is also a logic one which, as discussed, denotes repetition of the external clock signal.

The output of the zero detect circuit 50 receiving signals from stages 11-18 is fed directly to latch control network 24 (shown in phantom) and, in particular, to a first network 25 configured specifically for stages 11-18. (In this discussion, it is also assumed that coincidence of signals will not occur within ten stages. This can be guaranteed by selecting the appropriate delays between stages.) The output from the zero detect circuit 50 receiving signals from stages 11-18 is also coupled to a plurality of NOR circuits 52, 54, 56, 58, 60 & 62. The outputs of circuits 52, 54, 56, 58, 60 & 62 are respectively connected to corresponding latch control networks 25 for stages 19-26, 27-34, 35-42, 43-50, 51-58 and 59-66. (As discussed below, reset networks 25 each arbitrarily receive eight stages for processing. This is to reduce the capacitive loading on the trigger input to output latch 20.)

As a further operational example, the second zero detect circuit 50 receives signals from stages 19-26, and again transmits a logic zero output if none of its inputs are latched. This logic output is passed through an inverter 51 before being received at the input to the corresponding NOR gate, i.e., NOR gate 52. Since one input to NOR gate 52 is thus a logic one, the output is a logic zero and the latch control network for stages 19-26 remains disabled. Conversely, if a latch within stages 19-26 is set, then the output of the corresponding zero detect 50 is logic one. This logic output is inverted such that logic zero appears at both inputs to NOR gate 52 resulting in a logic one output therefrom. This also assumes that no latches were set in stages 11-18. (Again, a logic one output from the first zero detect circuit 50 will disable NOR gates 52, 54, 56, 58, 60 & 62.) The output of zero detect 50 for stages 19-26 is also input to NOR gates 56, 58, 60 & 62. NOR gates 56, 58, 60 & 62 receive the output of this zero detect circuit 50 since these gates receive at least one latch stage which is a multiple of one of latch stages 19-26. Thus, a logic one output from zero detect 50 for stages 19-26 disables any latch subsequently set which is a multiple thereof through the operation of NOR gates 56, 58, 60 & 62.

The described logic circuitry thus serves to isolate the first latch set to indicate repetition of the inputted external clock signal. One skilled in the art will also note that the same circuits and processing concepts are used for each of the remaining zero detect circuits 50 and their associated NOR gates.

Figure 8:
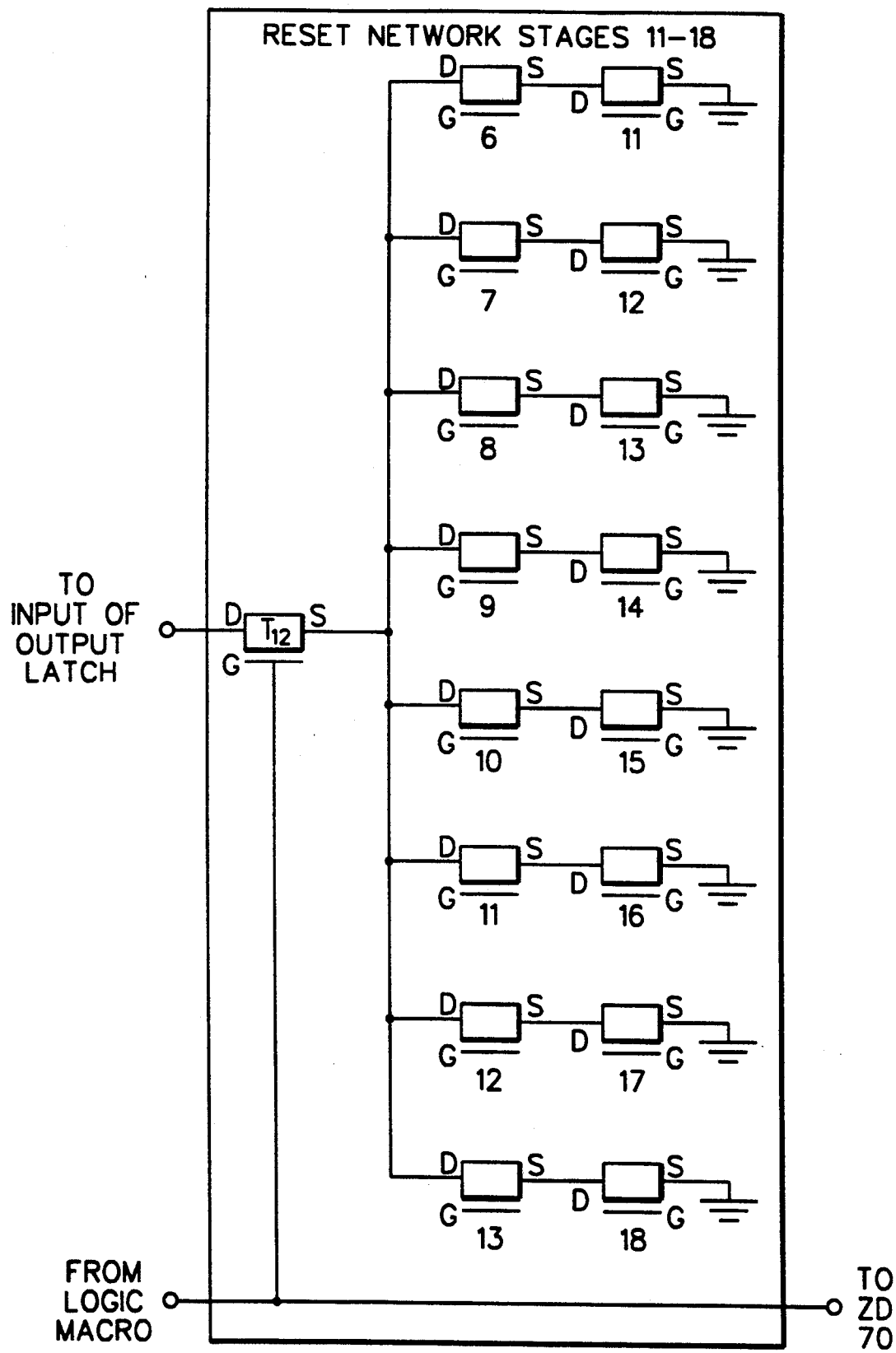
FIG. 8 is a schematic of one embodiment of the latch control network stage circuits of FIG. 7.

Latch control network stages 25 are substantially identical, and therefore only the first network 25 is discussed in detail below. In particular, one embodiment of a latch control network for stages 11-18 is depicted in FIG. 8. As shown, a first NFET $T_{12}$ is gated "G" by the output from the zero detect 50 for stages 11-18 (FIG. 7). The drain "D" of NFET $T_{12}$ is connected to the input of output latch 20, and the source "S" is coupled to the drain "D" of eight first NFETs contained in the parallel pairs of NFETs. The source "S" of each of the first of the parallel pairs of NFETs is coupled to the drain "D" of the second of the pairs of NFETs. The source "S" of each of the second of the parallel pairs of NFETs is coupled to ground. The second NFET in each pair of NFETs receives at its gate "G" one of the latch outputs from one of the respective L2 latch stages 11-18. The first NFET in each pair of NFETs receives at its gate "G" a pulse signal from a generator stage (see FIG. 1) which is at a preset relation to the stage having the latch output received at the second NFET in each pair. For example, if the stage gating the second NFET is stage N, then the first NFET is coupled to receive stage N−X wherein N equals one of stages 11-18 and X equals a preselected constant (in this case X=5).

Thus, the first NFET of the first pair of NFETs is driven by the pulse signal from stage 6 (i.e., N−X (11−5=6)). As noted, each L2 latch stage gates step N−X out of the pulse generator. For instance, if pulse number N is coincident with the input pulse, the input frequency is N times the basic stage delay. A latch is set by pulse N, this latch will gate the pulse number N−X to set the output latch the next time pulse N−X is generated. The compensation, X, for the clock latency can be specifically predetermined by one skilled in the art by circuit simulation of the entire generator, e.g. using an available simulation program such as SPICE. The total delay of the generator is divided by the basic delay of the delay generator to give the number of steps X that need to pregate the generator to achieve no latency.

The L2 latch output from stage 12 is similarly coupled with the pulse signal from stage 7, the latch output from stage 13 is coupled with the pulse signal from stage 8, the latch output from stage 14 is coupled with the pulse signal from stage 9, the latch output from stage 15 is coupled with the pulse signal from stage 10, the latch output from stage 16 is coupled with the pulse signal from stage 11, the latch output from stage 17 is coupled with the pulse signal from stage 12, and the latch output from stage 18 is coupled with the pulse signal from stage 13. Each of the remaining latch control network stages 25 of network 24 may be analogously configured. Those skilled in the art, however, will readily recognize that numerous configurations may be used to accomplish the function of the latch control network. For example, different numbers of stages could be grouped depending upon the need to reduce capacitive loading on the input to latch 20.

As noted above, the latch control network 24 sets the output latch 20. The control logic surrounding this network enables only one group of latches depending upon the position of the repeat pulse in the chain. For example, if the input period is N times the basic stage delay, then a latch is set at stage N, and this latch gates the pulse signal, for example, from stage N−X to the output latch the next time that pulse N−X is generated. Again, the latch for stage N is reset every cycle by the pulse from stage (N−3) to ensure that continuous sampling of the input clock is obtained. Initially, the first $T_{on}$ time will be two times the period, because it takes two cycles to determine the input frequency.

Returning to FIG. 7, if the input frequency is slower than expected, or if the inverter delay is faster than expected, a coincidence in signals may not be obtained. In such a case, the output latch is gated with the external clock signal. This is accomplished by sending the output from each of the grouped control logic stages (i.e., the first zero detect circuit 50, and NOR gates 52, 54, 56, 58, 60 & 62) to the input of a zero detect circuit 70. Circuit 70, which lacks the inversion function of circuits 50, outputs a logic one signal whenever all of its inputs are zero, i.e., meaning none of the latch control network stages 25 were enabled.

The output of zero detect circuit 70 is applied to the gate "G" of a first NFET $T_{10}$ of two serially connected NFETs $T_{10}$ & $T_{11}$. The source "S" of NFET $T_{10}$ is connected to ground while the drain "D" is connected to the source "S" of NFET $T_{11}$. NFET $T_{11}$ receives at its gate "G" the external clock signal, and the drain "D" is coupled to the input of output latch 20. Thus, when no repetition of the input signal occurs, zero detect circuit 70 activates NFET $T_{10}$, and with the next external clock rising edge causes a clocking of output latch 20. Again, the delays through network 10 will be selected based on the anticipated external clock frequency to be inputted.

Figure 9:
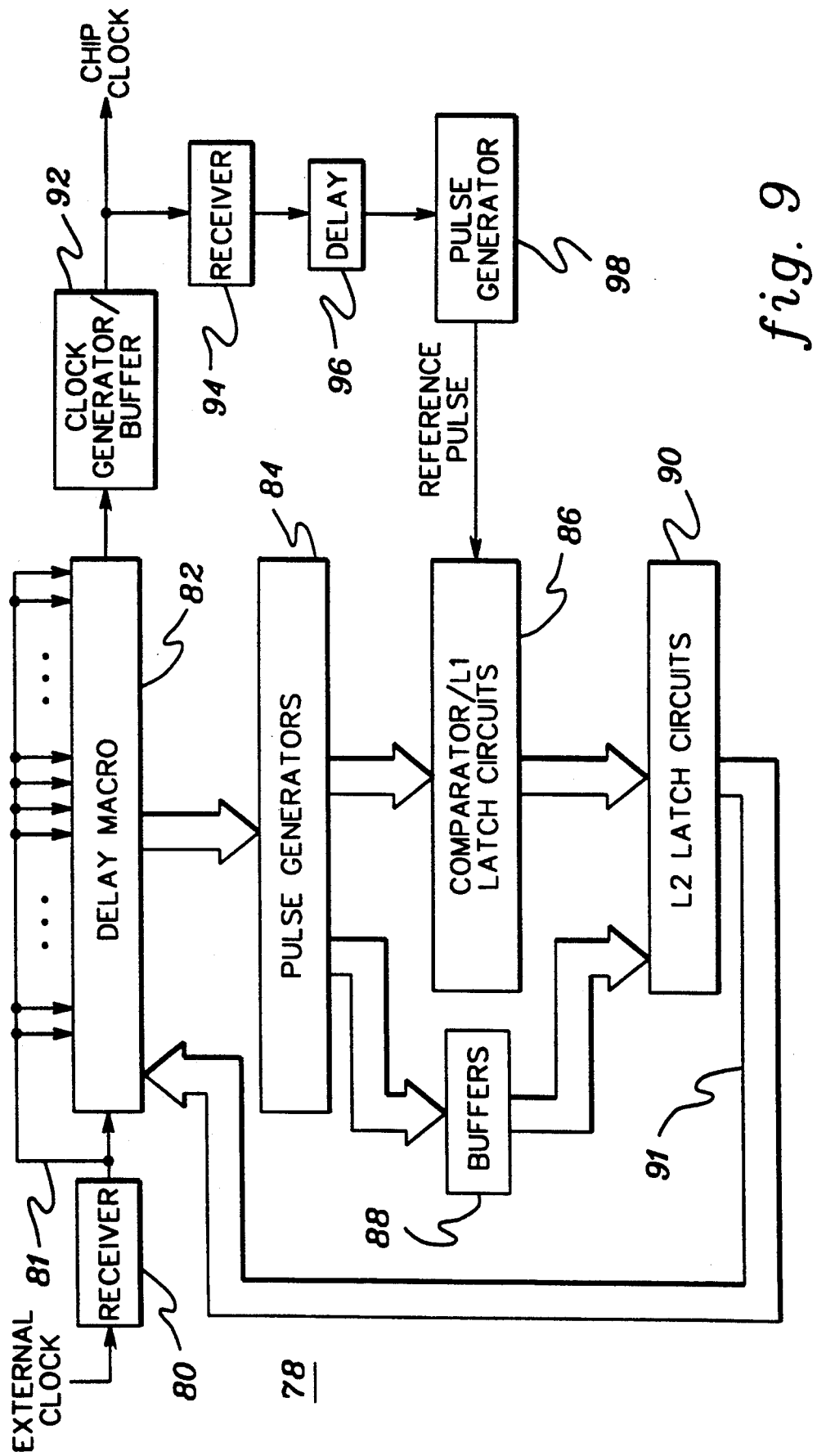
FIG. 9 is a schematic overview of another embodiment of a clock signal latency elimination network pursuant to the present invention.
Figure 10:
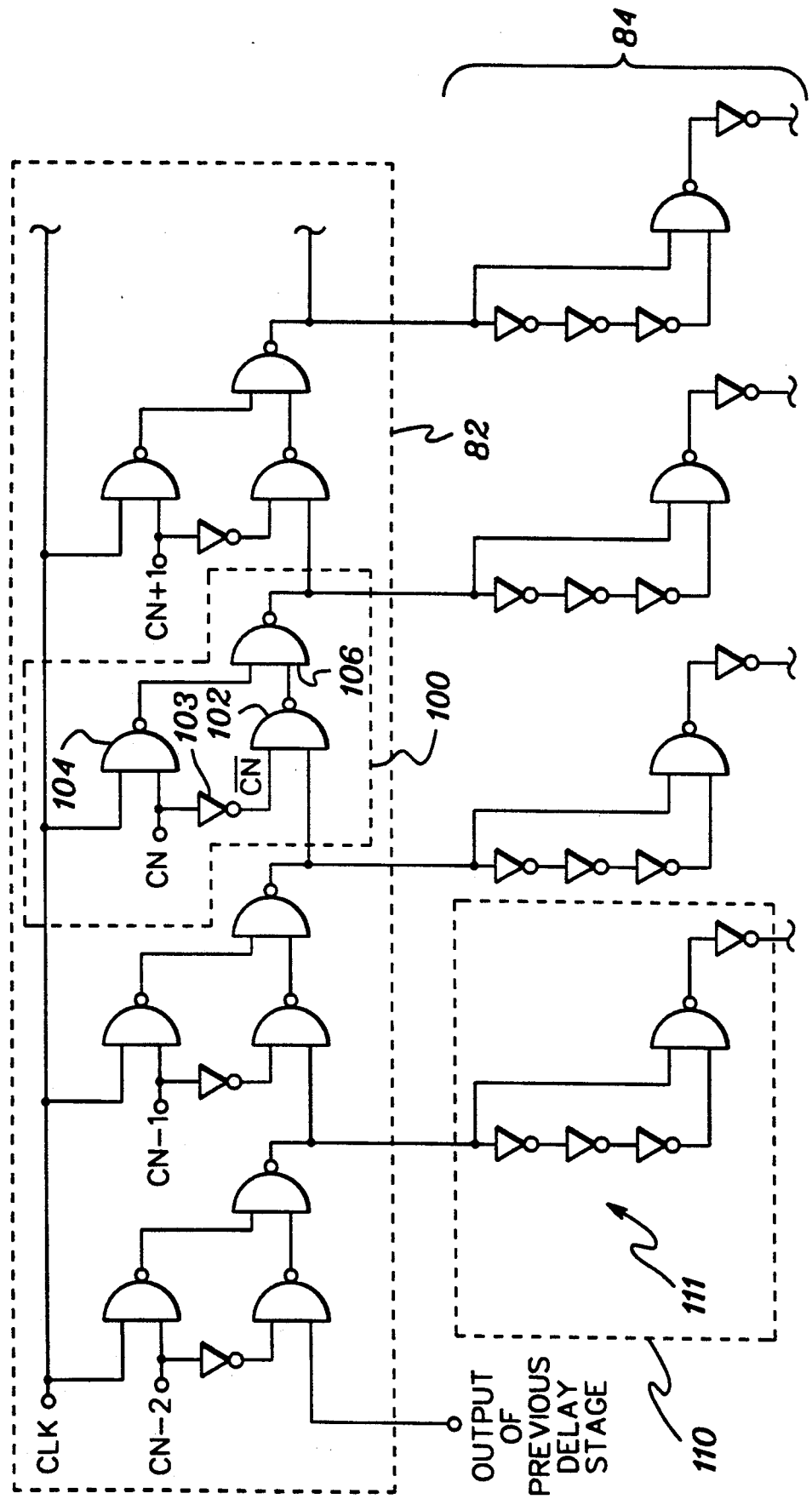
FIG. 10 is a more detailed schematic of the delay macro and pulse generators of the network embodiment of FIG. 9.

An alternate implementation, generally denoted 78, of the present invention is depicted in FIGS. 9 & 10. As with the first implementation, the object is to eliminate external clock skew between chips and to reduce the clock latency on chip to a small fraction of its actual delay. These objects are accomplished in this embodiment in a self-compensating implementation. The circuitry senses the on-chip delay of the receiver and the clock generator or buffer. Through a delay chain the input clock is then delayed by one cycle minus the internal delay of the clock receiver and clock generator/buffer circuits. The circuitry requires several cycles when the system is initially turned on to become synchronized with the system clock. After a reset or equivalent control input, the phase difference is transparent to the user. Again, all circuits are digital without the need of any external components.

Referring first to FIG. 9, an external clock signal is received at the input to a receiver 80 and passed to the input of a delay macro 82. The external clock is also passed directly to the individual delay stages of macro 82 via line 81 as described further below. Delay macro 82 outputs a plurality of sequential delay signals to pulse generators 84. Each delay signal, which is delayed from the previously outputted delay signal by the delay of the delay stage therebetween, is fed to a separate one of a plurality of pulse generator stages. Each pulse generator stage outputs a pulse signal in response to a received delay signal. The pulse signals are provided to the inputs of comparator/L1 latch circuits 86, which together with circuits 82 and 84 operate to continuously determine the frequency (or period) of the external clock signal input to receiver 80.

Comparator/L1 latch circuits 86 respectively compare each pulse from generators 84 to a pulse generated from the output of a clock generator 92 coupled to the output of delay macro 82. The output of clock generator 92, which comprises the chip clock, is fedback to a receiver 94 which operates to mimic the delay in receiver 80. A preselected delay 96 is coupled between the output of receiver 94 and the input to a pulse generator 98. Generator 98 outputs a reference pulse to comparator/L1 latch circuits 86. When a match is found by circuits 86, the corresponding L1 latch is set and then transferred to L2 latch circuits 90 in a manner similar to the operation of the previously described latch circuits. L2 latch circuits 90 output via bus 91 to delay macro 82 control signals which operate to select the external clock insertion point in delay macro 82, which is described further below with reference to FIG. 10. Although not shown, the L2 latch circuits could be gated by a signal output from a 2-input NAND gate. The first input of the NAND gate would be corrected to the output of a divide by two D-latch, which would be driven by the external clock signal, and the second input of the NAND circuit would be coupled to receive the pulse signal output from the generator corresponding to the last delay macro delay stage.

When the system is initiated, the external clock is fed to the beginning of delay macro 82. As the clock propagates along the delay macro, narrow pulses are generated by the pulse generators. At each instant, the presence of the pulse at the output of each pulse generator indicates the position of the clock in the delay line. Because of process tolerances the clock signal can require up to three cycles before it reaches the end of delay macro 82, and thus, the clock generator/buffer. A few nanoseconds later, the chip clock will be set. The chip clock is fed to the chip and to a receiver similar to the clock receiver at the clock input. The receiver on the internal clock network is used to identify the delay of its circuit so that it can be compensated and eliminated from the latency. The output of the receiver is fed to a short delay macro 96 from which a reference pulse is generated and compared to all previous pulse generator outputs. Several matches may occur and therefore several latches would be set. The matching latch closest to the end of the delay line 82 is selected to identify where the external clock should be inserted into the delay macro. The control line feedback 91 from L2 latch circuits 90 to delay macro 82 is explained further below.

The delay from the point of insertion to the end of the delay macro plus the delay through the clock generator, receiver and small delay line is equivalent to one clock cycle. Once the operating point has been determined, the system will continue to sample every cycle for the position of the delay that corresponds to a delay of one cycle. To compensate for the small delay line, each latch will gate the control signal Y stages earlier in the delay macro, Y being the number of stages in the small delay line. The offset of Y bits is necessary to allow the system to track shifts in delay that are faster or slower because of temperature or voltage variations. The accuracy limit is determined by the worst case delay of a stage in the delay macro. The minimum number of stages is determined by the frequency of operation divided by the best case delay of a basic stage. The worst case latency and clock skew should be equal to the worst case delay of the basic stage.

In the embodiment shown in FIG. 10, delay macro 82 comprises a chain of two way NAND gates. Each delay stage of the chain is identical except for the control signal input to the respective parallel connected NANDs. Therefore only one delay stage 100 will be described in detail. Delay stage 100 includes first and second parallel connected NANDs 102 and 104, respectively. A first input to NAND 102 is connected to the output of the previous delay stage and to the input of a corresponding pulse generator stage 110, while the second input to NAND gate 102 receives an inverted (through inverter 103) control signal $\overline{CN}$ from L2 latch circuits 90 (which are depicted in FIG. 9). The second NAND gate 104 receives at a first input a corresponding control signal CN from circuits 90 (FIG. 9) and at a second input the external clock signal via line 81. The outputs of NAND gates 102 and 104 are tied respectively to another two way NAND gate 106. The output of NAND gate 106 comprises the delay stage 100 output. In operation, if control CN is asserted, $\overline{CN}$ will open the delay chain and any previous processing stages of the delay line will be effectively removed from the delay macro, with the external clock input being inserted to the macro at this stage through NAND gate 104. In this manner, circuit 78 is self-compensating in acting to obtain the desired one cycle offset between the chip clock and the received external clock. It should also be noted from FIG. 10 that the pulse generator stages are configured differently than in the previous embodiment. In this case, the width of the pulse output from each generator stage is defined by the delay inherent in several serially connected inverters 111.

Figure 11:
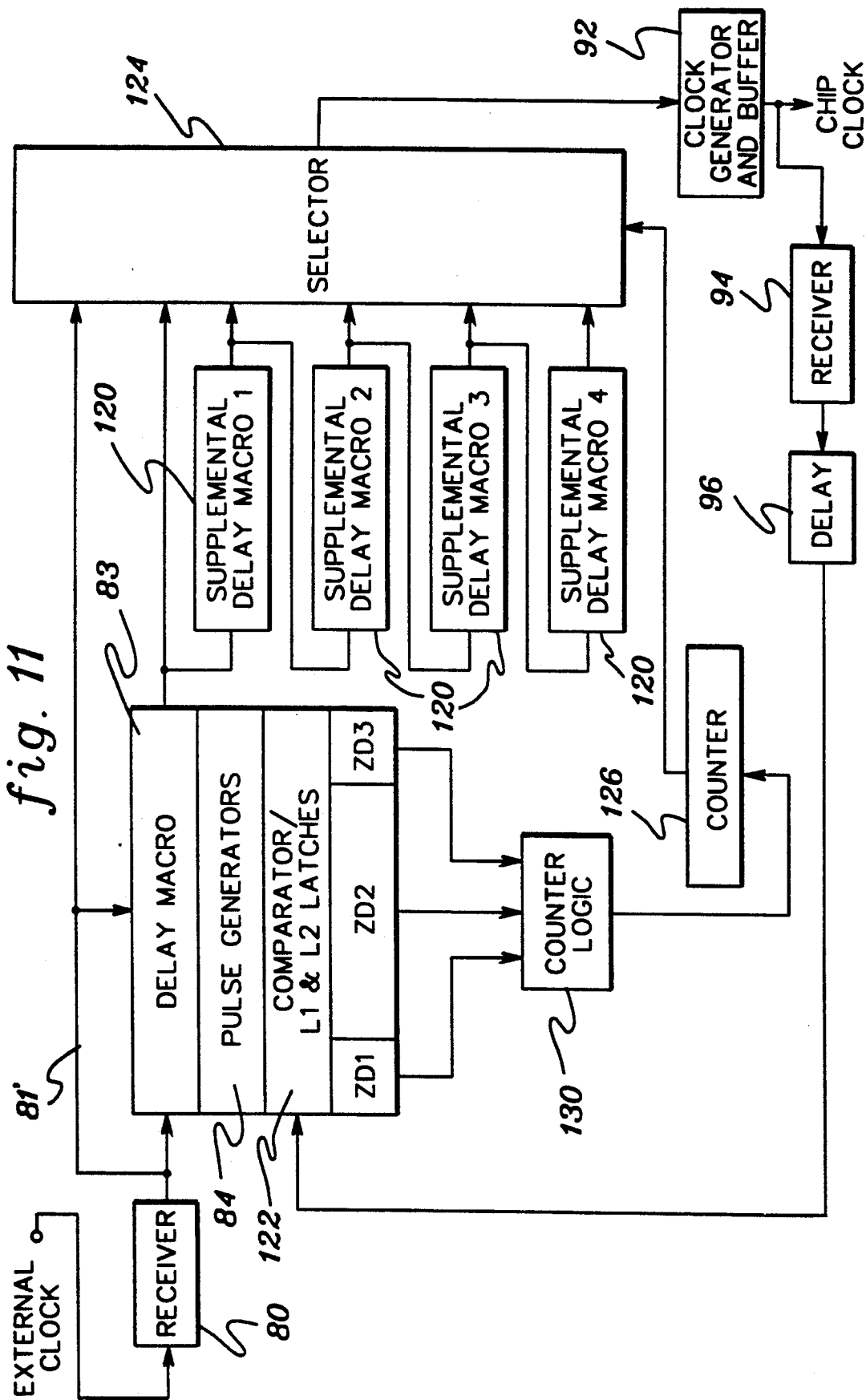
FIG. 11 is a schematic overview of a further embodiment of a clock signal latency elimination network pursuant to the present invention.

FIG. 11 depicts a variation of the clock latency elimination circuit embodiment of FIGS. 9 & 10. The object of this modification is to reduce the total hardware required. In this embodiment, a plurality of delay macros 120 (i.e., supplemental delay macro 1, supplemental delay macro 2, supplemental delay macro 3 and supplemental delay macro 4) are added, all of which are the same length and shorter in length than the main delay macro 83, which drives the pulse generator 84 and comparator/L1 & L2 latches 122. (Also, main delay macro 83 is shorter in length than the delay macros of the previous embodiments.) One or more of the supplemental delay macros can be inserted in series with delay macro 83 as required to attain a desired chip clock signal at the output of a clock generator/buffer 92. The number of pulse generator states varies with the length of the selected delay line. A selector 124, which is controlled by a counter 126, selects the number of supplemental delay macros to be serially connected to macro 83.

Each comparator/L1 & L2 latch circuit 122 output is fed to a logic macro which includes three different groupings of zero detect circuits, namely, ZD1, ZD2 & ZD3. Zero detect groupings ZD1 and ZD3 preferably receive a small number of latch output stages (e.g., 4) relative to zero detect grouping ZD2 (e.g., 24). The object of this network grouping is to have the repetition in signal identified in the zero detect group ZD2 as opposed to either zero detect group ZD1 or ZD3. This is to ensure locating of subsequent external clock signals within the delay line selected (i.e., delay macro 83 plus any supplemental delay macro 120). The outputs to the zero detect circuits are tied to a counter logic circuit 130 which outputs a high/low signal depending upon the state of the zero detect circuits. The output of counter logic 130 is passed to counter 126. Also, although not shown, both comparator/L1 & L2 latch circuits 122 and counter 126 could be gated by signals derived through circuitry similar to that described above in connection with the gating of the L2 latch circuits 90 of FIG. 9. The operation of this circuit embodiment is described below.

Initially, with the counter 126 set to zero, the first external clock pulse will travel through delay macro 83 and bypass supplemental delay macros 120. Clock generator 92 will drive receiver 94 and delay 96 as described in connection with the previous embodiment. The output pulse from delay 96 is compared to each of the pulses output from pulse generator 84 in comparator/L1 & L2 latch circuits 122. If no match occurs, the counter is incremented via counter logic 130, which adds supplemental delay macro 1 to the delay line. Thus, the next pulse is delayed by delay macro 83 and supplemental delay macro 1. Again, the circuit checks for a match at comparator/L1 & L2 latch circuits 122, and if no match occurs, counter 126 is again incremented and the next pulse must pass through delay macro 83, supplemental delay macro 1 and supplemental delay macro 2. This process is repeated until a match occurs, at which time the counter is not incremented and the circuit remains in the same loop. The zero detect macro is divided into three groups (i.e., ZD1, ZD2 and ZD3) to sense when the match occurs close to either end of delay macro 83. The counter will be incremented or decremented to reset the operating point towards the middle of the main delay macro. If no match is found when the maximum delay is serially inserted, selector 124 will switch to bypass all of the latency elimination circuitry such that the external signal passes from receiver 80 directly to clock generator/buffer 92 via line 81'. This ensures that the circuit will propagate the clock under any condition, such as low input frequency for chip characterization and logic debugging.

The FIGS. 9-11 embodiments of the present invention comprise self-compensating latency elimination circuits that use a variable length delay macro, a multiple pulse generator macro and a comparator/L1 & L2 latch macro. The design can be built on the bit basis and replicated as needed for a given frequency of operation. Each circuit senses every cycle the delay stages necessary to delay the external clock by one cycle thus allowing the circuits to track any voltage and/or temperature variations. The range of operation allows for full process variation. Each design is in essence a controllable one cycle delay line, with its length monitored every cycle.

A different circuit approach is next described with reference to FIGS. 12-15. Again, the circuitry can dynamically compensate for system clock path delay changes so that it remains relatively fixed over manufacturing, temperature and power supply variations. Advantages of the circuitry include that it can be implemented with gate array digital logic, is particularly advantageous for CMOS technology, has low gate count for small chip area, can be implemented at multiple points in the clock distribution line, and allows higher system performance using lower cost technology.

Figure 12:
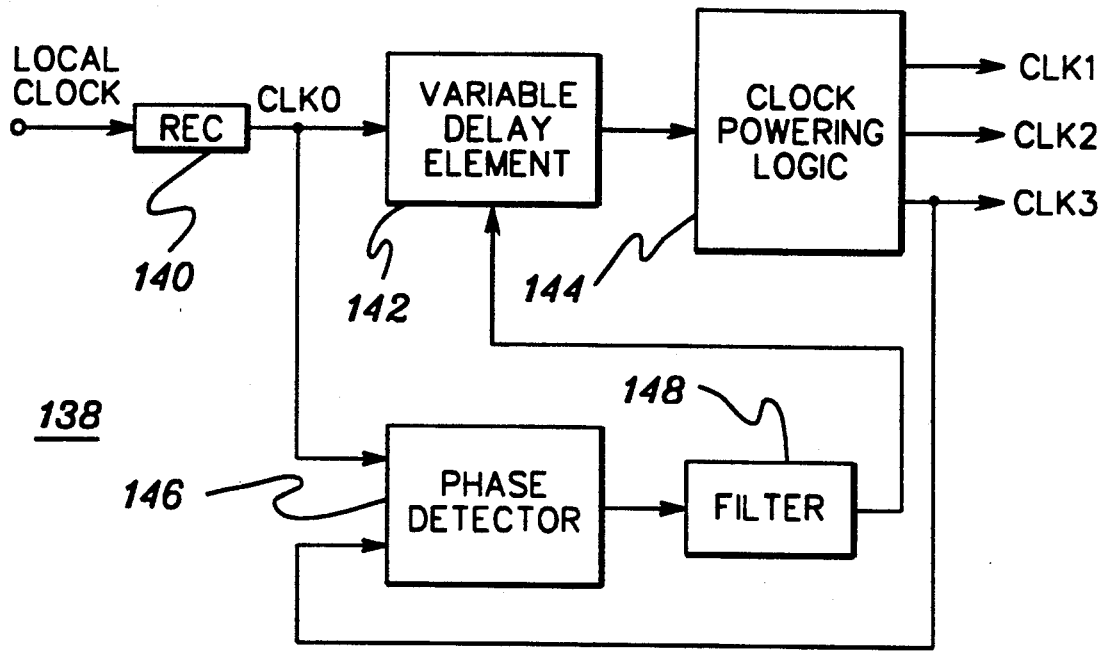
FIG. 12 is a schematic overview of another embodiment of a clock signal latency elimination network pursuant to the present invention.

Referring first to FIG. 12, a generalized feedback circuit, circuit 138, is shown to compensate for delay variations in the clock path. After passing through a receiver 140, the external clock is input to a variable delay element 142 which is inserted between the receiver and a clock powering logic 144. Conventionally, the clock path is designed in such a way that CLK1, CLK2, and CLK3 clock outputs from logic 144 are all in phase. This is accomplished by balancing the loads and physical nets for each clock path.

Timing uncertainty can arise in the conventional circuit (i.e., receiver 140 and clock powering logic 144) from the fact that each time the clock path is fabricated or subjected to different power supply or temperature variations, the delay through the powering stage 144 will change. Note, however, that chip clocks CLK1, CLK2 and CLK3 remain in phase. Each clock path will usually increase or decrease equally in delay. In a conventional system design, the change in delay for all clock paths is bounded and quantified by a set of distributions. The timing uncertainty for the entire system is then analyzed and a performance constraint (cycle time) is calculated. Hence, higher system performance can be realized with tighter clock distributions. Clock distributions can be improved by developing higher performance (expensive) technologies or by reducing the distributions of existing, less costly technologies.

Variable delay element 142 is designed to produce a delay from the input of receiver 140 to the output of clock powering logic 144 to be one clock period. The external clock period (CLK0) is used as a timing reference and the clock period is assumed to be stable over time. Use of the clock period as a timing reference eliminates the need for external components. One of the chip clock outputs (e.g., CLK3) is sent back to a phase detector 146 which also receives as an input the external clock signal (CLK0). Nominally, the two signals at the inputs to phase detector 146 are in phase. The output of detector 146 is filtered 148 to smooth the response of the feedback signal sent to variable delay element 142. This filtering averages the results of the phase detector to avoid spurious responses due to noise or clock jitter. The filter output, which is used to alter the delay through variable delay element 142, is used to fix the clock path delay at approximately one clock period.

Circuit 138 operates as follows. Initially, the two inputs (CLK3 and CLK0) to phase detector 146 are in phase (i.e., since CLK3 is delayed by one full clock cycle relative to CLK0). As chip process, temperature or power supply changes, the delay through the clock path will vary. This change will produce a phase difference at the input to phase detector 146. Detector 146 will output a signal indicating that the compensated path is now more or less than one clock period. This information is accumulated in the filter circuitry (which as described below may include one or more counters) until a threshold is reached. Once the threshold is reached, filter 148 indicates a predominant (i.e., more or less delay than one clock period) offset. This filter then signals variable delay element 142 to alter the delay through the clock path. Element 142 will add or delete delay in such a way as to cause the two clock phases at the input to the phase detector to realign. Hence the compensated delay path will return to one clock cycle.

Figure 13:
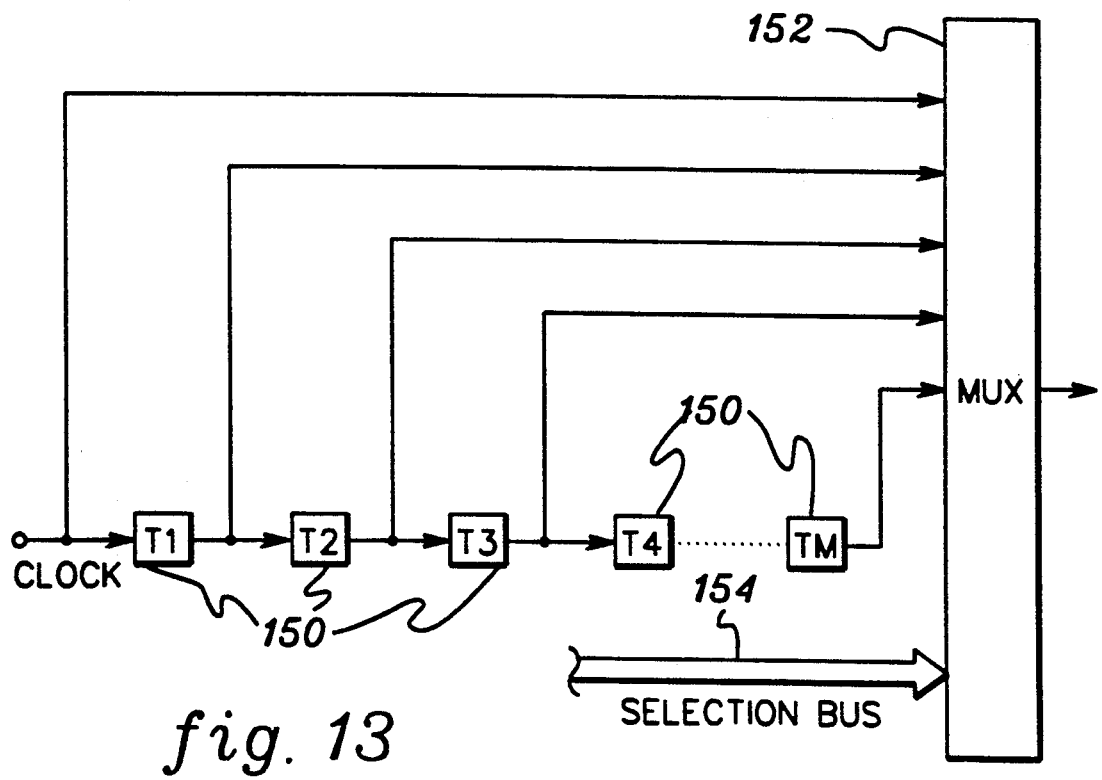
FIG. 13 is a more detailed schematic of the variable delay element of the network embodiment of FIG. 12.
Figure 14:
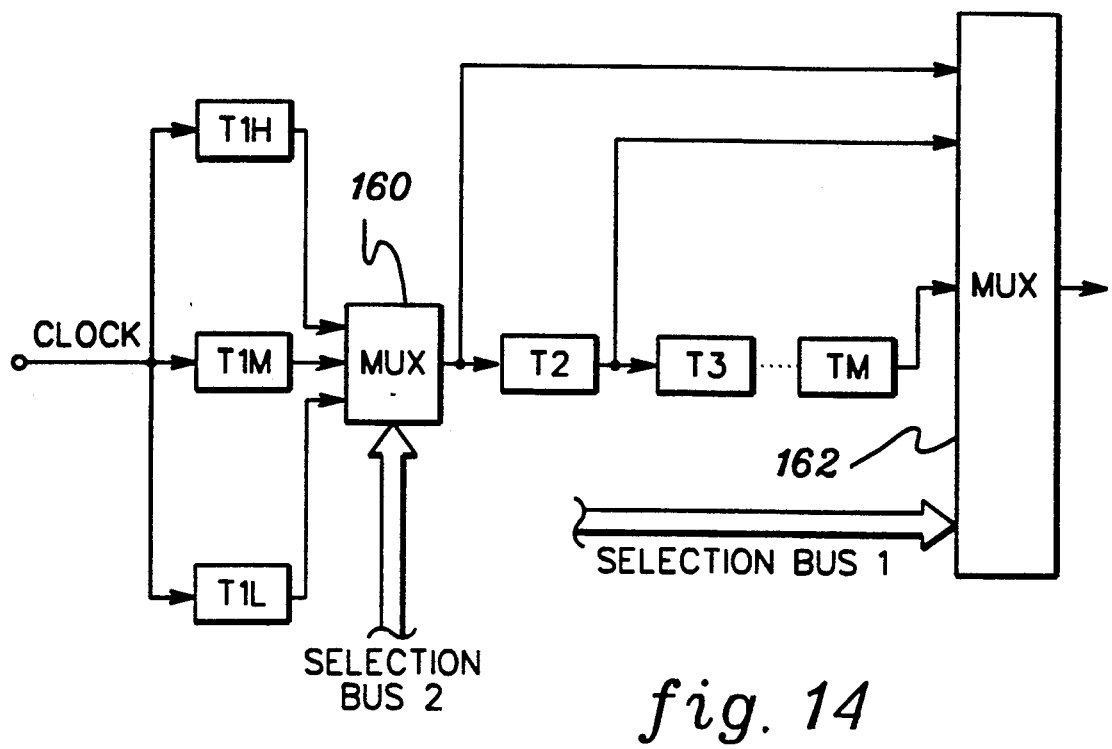
FIG. 14 is a more detailed schematic of an alternative embodiment of the variable delay element of the network embodiment of FIG. 12.
Figure 15:
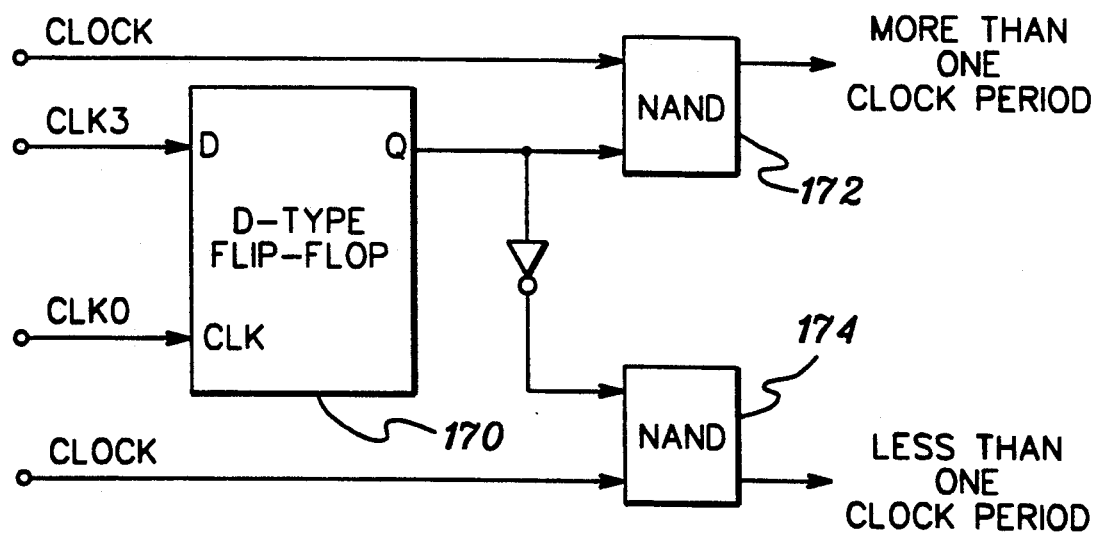
FIG. 15 is a more detailed schematic of the phase detector of the network embodiment of FIG. 12.

Possible implementations of variable delay element 142 and phase detector 146 of circuit 138 are depicted in FIGS. 13-15. Preferably, the phase detector, filter and variable delay element comprise only digital logic gates. FIG. 13 depicts a first embodiment of the variable delay element 142. In this embodiment, incremental delay elements 150, i.e., T1, T2, T3, T4 . . . TM, are realized with standard digital logic gates lightly loaded to minimize delay. The limitation (tolerance) of the circuit is one digital gate delay. A multiplexer 152 selects the desired delay through the delay line. Selection is controlled by the selection signal sent from filter 148 to multiplexer 152 on the selection bus 154.

Improved resolution can be achieved at the expense of slightly greater complexity as shown in FIG. 14. In this embodiment, similar high, medium and low powered digital gates, T1H, T1M, T1L, are placed in parallel as a substitution for one or more of the existing gates shown in FIG. 14. Each incremental delay element provides a clock signal which is slightly offset in phase to a greater or lesser extent. Thus, finer selection can be provided at certain stages of the delay line, e.g., where selection is anticipated. The delay elements (e.g., T1H, T1M, T1L) are logically OR'd in a multiplexer 160 by a selection bus 2 and then AND'd together (by a multiplexer 162 and selection bus 1) to provide the selection process.

One implementation for phase detector 146 is depicted in FIG. 15. In this embodiment, a D-type flip-flop 170 comprises the logical storage element that samples the phase of the chip clock (CLK3) and of the reference clock (CLK0) with each clock cycle. Two 2-input NAND gates 172 and 174 are used to create a pulse out of either a more than one clock period output or a less than one clock period output.

The filter 148 of FIG. 12 can comprise a simple up-/down counter. If there is a predominance of more than one clock period counts, the counter reaches a threshold on the upside, indicating that the delay in the clock powering stage is too large and that the variable delay needs to be less. Conversely, if there is a predominance of less than one clock period counts, the counter reaches a threshold on the downside, which means that the delay on the clock powering stage is too short and delay needs to be greater. The up/down counter will remain between the two thresholds while the average clock phase is delayed in time by approximately one clock period.

It will be observed from the above discussion that various clock signal latency elimination networks have been described herein, each of which is digital in implementation and does not require any external components. The clock latency elimination networks eliminate or significantly reduce clock latency created on a microprocessor chip by its internal clock generator. Further, clock skew between chips of a multichip system is also reduced, thereby increasing system performance. In all embodiments, the invention dynamically compensates for delay variations in the clock path as a function of temperature, power supply, and manufacturing tolerances for solid state circuitry.

Although a specific embodiment of the present invention has been illustrated in the accompanying drawings and described in the forgoing detailed description, it will be understood that the invention is not limited to the particular embodiments described herein, but is capable of numerous rearrangements, modifications, and substitutions without departing from the scope of the invention. For example, the timing network of the present invention could operate such that the chip clock signal is delayed by any interger multiple of the input clock signal. Further, the timing network could compensate for internal clock delay in a distribution tree involving multiple semiconductor chips. The following claims are intended to encompass all such modifications.

We claim:

1. A semiconductor chip circuit for generating at the output of a predetermined internal clock circuit a chip clock signal which lags an input clock signal by a cycle, said semiconductor chip circuit comprising:
   means for determining a delay experienced by said input clock signal passing through said predetermined internal clock circuit; and
   means, responsive to said delay determining means, for triggering a delay clock signal within said predetermined internal clock circuit to generate at the output thereof said chip clock signal, said delay clock signal triggered within said predetermined internal clock circuit being offset from said input clock signal by a clock cycle minus a length of time substantially equal to the determined delay through said predetermined internal clock circuit such that the generated chip clock signal output from said internal clock circuit is substantially in phase with and lagging by at least one cycle the input clock signal, thereby reducing clock latency internal to the semiconductor chip.

2. The semiconductor chip circuit of claim 1, wherein said determining means continuously monitors and determines the delay experienced by said input clock signal passing through said predetermined internal clock circuit.

3. The semiconductor chip circuit of claim 1, wherein said semiconductor chip circuit includes:
   a variable delay line having a plurality of serially connected delay elements, each of said delay elements outputting a delay clock as the input clock signal propagates through the variable delay line;
   a plurality of pulse generators, each of said pulse generators being coupled to receive a respective one of said delay clocks and output in response thereto a pulse signal, each of said pulse signals having a duration substantially less than the period of said input clock signal; and
   a control network for identifying the generator pulse signal which produces a delay line delay clock having a phase offset from said input clock signal equal to the determined delay through the predetermined internal clock circuit.

4. The semiconductor chip circuit of claim 3, wherein each delay element of said variable delay line receives said input clock signal and said control network further includes means for disabling the delay elements in said delay line previous to the delay element corresponding to the generator pulse signal selected by said control network.

5. The semiconductor chip circuit of claim 3, wherein said control network includes a feedback loop coupled to receive the output of said delay line, said feedback loop including duplicate circuitry to at least some of said predetermined internal clock circuit.

6. The semiconductor chip circuit of claim 3, further comprising:
   at least one supplemental delay line; and
   means for selectively connecting said at least one supplemental delay line in series with said variable delay line so as to selectively increase the total delay through the delay line.

7. The semiconductor chip circuit of claim 6, wherein the means for selectively connecting includes a selector circuit, said selector circuit being controlled via a select signal produced by said control network.

8. A digital clock timing network for an integrated circuit chip having an internal clock circuit with a predetermined delay therethrough, said digital clock timing network receiving an input clock signal and generating therefrom a timing signal, said timing signal being passed through said chip's internal clock circuit to produce a chip clock signal, said chip clock signal being in phase with and offset from said input clock signal by at least one cycle, said digital clock timing network comprising:
- a delay circuit having an input coupled to receive said input clock signal, said delay circuit including a plurality of serially connected delay stages, each of said delay stages outputting a corresponding delay signal as said input clock signal propagates through said delay circuit;
- a plurality of pulse generators, each of said pulse generators being coupled to receive a respective one of said delay signals and output in response thereto a pulse signal, each of said pulse signals having a duration substantially less than the period of said input clock signal; and
- a control network coupled to receive as input said pulse signals output from said plurality of pulse generators, said control network generating a timing signal for output to said internal clock circuit, said timing signal having a period equal to a multiple of the period of said input clock signal minus an interval of time substantially equal to the predetermined delay through the internal clock circuit of said integrated circuit chip such that passing of said timing signal through said internal clock circuit produces a chip clock signal output substantially in phase with and offset by at least one cycle from said input clock signal.

9. The digital clock timing network of claim 8, wherein said control network includes a comparator circuit for determining the period of said input clock signal.

10. The digital clock timing network of claim 9, further comprising an output latch for outputting said timing signal and wherein said control network includes logic circuitry for identifying the first stage N generator pulse signal commensurate with one complete cycle of said input clock signal and for selecting the pulse signal generated by generator stage N−X for controlling said output latch, wherein X comprises the number of delay stages required to produce a delay approximately equal to the predetermined delay through said internal clock circuit.

11. The digital clock timing network of claim 10, wherein said delay circuit includes a plurality of serially connected inverters, and wherein the output of an inverter is connected to the input of the next inverter in the serially connected line of inverters.

12. The digital clock timing network of claim 11, wherein each delay stage of said delay circuit includes a first inverter and a second inverter, the output of the first inverter being connected to the input of the second inverter, and wherein each of said pulse generators is coupled to receive the output of the first inverter or the output of the second inverter of its respective delay stage.

13. The digital clock timing network of claim 12, wherein each of said pulse generators includes a 2-input NAND gate, each of said NAND gate inputs being connected to receive a delay signal from a different delay circuit delay stage, the time delay between said received delay signals defining the duration of the pulse signal output from the respective pulse generator.

14. The digital clock timing network of claim 8, wherein said control network includes a plurality of comparator/latch circuits for identifying at which pulse signal the input clock signal repeats.

15. The digital clock timing network of claim 14, wherein said control network includes means for isolating a first comparator/latch circuit set as indicative of repetition of said input clock signal.

16. The digital clock timing network of claim 15, further comprising a plurality of second latch circuits, each of said second latch circuits being coupled to the output of a respective one of said comparator/latch circuits, wherein the second latch circuit is set corresponding to said comparator/latch circuit set as an indication of repetition of said input clock signal.

17. The digital clock timing network of claim 16, wherein said control network further includes means for resetting each set comparator/latch circuit prior to propagation of a next input clock signal cycle through the comparator/latch circuits.

18. An integrated semiconductor chip circuit for reducing clock latency resulting from passing an input clock signal through a predetermined internal clock circuit to produce a chip clock signal, said predetermined internal clock circuit including a receiver and clock powering logic, said integrated circuit comprising:
- a variable delay element connected between said receiver and said clock powering logic of said predetermined internal clock circuit, said variable delay element including a control input for receiving a select signal determinative of a delay therethrough, said variable delay element receiving at a first input said input clock signal after passing through said receiver of said predetermined internal clock circuit;
- a phase detector coupled to receive as inputs the input clock signal applied to the variable delay element and said chip clock signal being output from said clock powering logic, said phase detector outputting a phase difference signal representative of the difference in phase between said clock inputs; and
- control circuitry associated with the phase detector for receiving said phase difference signal and producing therefrom the select signal, said control circuitry including means for applying said select signal to the control input of said variable delay element, said select signal operating to select the clock delay through said variable delay element such that said chip clock signal output from said clock powering logic is substantially in phase with and offset from said input clock signal by at least one clock cycle.

19. The integrated circuit of claim 18, wherein said variable delay element includes:
- a plurality of incremental delay elements serially connected in a delay line, each delay element outputting a delay signal; and
- a first multiplexer coupled to receive the output of each delay element in the delay line, said first multiplexer also having a control input for receiving the select signal produced by said control circuitry, wherein said control circuitry selects the length of the delay through the delay line by selecting one of the delay signals output from the respective delay elements for output to the clock powering logic.

20. The integrated circuit of claim 19, wherein at least one of said delay elements includes multiple parallel connected phase offset elements, each of said phase offset elements being powered differently so as to have a different delay therethrough, said at least one delay element of parallel connected phase offset elements also having a second multiplexer for selecting one of the phase offset elements for inclusion in the delay line, said second multiplexer including a control input which is coupled to receive said select signal from the control circuitry, said control circuitry selecting through said second multiplexer the appropriate phase offset delay to be output from said at least one delay element.

21. The integrated circuit of claim 18, wherein said phase detector includes a D-type flip-flop having said input clock signal applied to a first input and said chip clock signal applied to a second input thereof, said D-type flip-flop outputting a difference signal which is applied to a first input of a first 2-input NAND gate and through an inverter to a first input of a second 2-input NAND gate, a second input of said first 2-input NAND gate receiving said input clock signal and the second input to said second 2-input NAND gate receiving said chip clock signal, whereby the outputs of said first and second NAND gates are applied to said control circuitry and comprise said phase difference signal.

22. The integrated circuit of claim 18, wherein said phase difference signal comprises one of an up signal and a down signal, said up signal directing said control circuitry to produce a select signal which selects an increased delay through the variable delay element, said down signal directing the control circuitry to produce a select signal which selects a decreased delay through the variable delay element.

23. The integrated circuit of claim 22, wherein said control circuitry includes an up/down counter coupled to receive the phase difference signal output from said phase detector, said up/down counter being incremented with receive of an up signal and decremented with receipt of a down signal.

24. The integrated circuit of claim 23, wherein said control circuitry includes threshold counters coupled to the output of said up/down counter, said threshold counters only outputting a select signal after the up/down counter has exceeded a preset high or low threshold for selection of a different delay length through the variable delay element.

* * * * *

UNITED STATES PATENT AND TRADEMARK OFFICE
CERTIFICATE OF CORRECTION

PATENT NO. : 5,272,729
DATED : Dec. 21, 1993
INVENTOR(S) : Bechade et al.

It is certified that error appears in the above-indentified patent and that said Letters Patent is hereby corrected as shown below:

On the title page: Inventors;
Section [75] delete "Bruce Kaufmann" and substitute therefor
--Bruce Kauffmann--.

Column 20, line 16, delete "receive" and substitute therefor
--receipt--.

Signed and Sealed this

Thirty-first Day of May, 1994

Attest:

BRUCE LEHMAN

Attesting Officer        Commissioner of Patents and Trademarks